United States Patent
Hosoe et al.

(10) Patent No.: US 7,755,366 B2
(45) Date of Patent: Jul. 13, 2010

(54) CALIBRATION CIRCUIT, SEMICONDUCTOR DEVICE INCLUDING THE SAME, AND METHOD OF ADJUSTING OUTPUT CHARACTERISTICS OF SEMICONDUCTOR DEVICE

(75) Inventors: Yuki Hosoe, Tokyo (JP); Koji Kuroki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 249 days.

(21) Appl. No.: 11/889,762

(22) Filed: Aug. 16, 2007

(65) Prior Publication Data

US 2008/0054981 A1 Mar. 6, 2008

(30) Foreign Application Priority Data

Aug. 29, 2006 (JP) ............................. 2006-231561

(51) Int. Cl.
*G01R 35/00* (2006.01)
*G01D 18/00* (2006.01)

(52) U.S. Cl. ......................................... 324/601; 702/85
(58) Field of Classification Search ................. 324/601; 702/85

See application file for complete search history.

(56) References Cited

U.S. PATENT DOCUMENTS

| | | | |
|---|---|---|---|
| 6,466,487 B1 | 10/2002 | Otsuka | |
| 6,756,812 B2 | 6/2004 | Nagano et al. | |
| 7,038,486 B2 | 5/2006 | Aoyama et al. | |
| 7,194,667 B2 * | 3/2007 | McBride | 714/718 |
| 7,215,128 B2 * | 5/2007 | Fujisawa | 324/601 |
| 7,339,399 B2 * | 3/2008 | Kurisu | 326/30 |
| 7,548,087 B2 * | 6/2009 | Kuroki | 326/30 |
| 2004/0085690 A1 * | 5/2004 | Ito et al. | 361/18 |

FOREIGN PATENT DOCUMENTS

| | | |
|---|---|---|
| JP | 10-041803 | 2/1998 |
| JP | 2000-183717 A | 6/2000 |
| JP | 2000-332591 A | 11/2000 |
| JP | 2002-094366 A | 3/2002 |
| JP | 2002-152032 A | 5/2002 |
| JP | 2003-298395 A | 10/2003 |
| JP | 2004-032070 A | 1/2004 |
| JP | 2005-039549 A | 2/2005 |
| JP | 2005-159702 A | 6/2005 |
| JP | 2005-229177 A | 8/2005 |
| JP | 2006-203405 A | 8/2006 |

* cited by examiner

*Primary Examiner*—Amy He
(74) *Attorney, Agent, or Firm*—Foley & Lardner LLP

(57) ABSTRACT

A calibration circuit includes: a replica buffer that drives a calibration terminal ZQ; a reference voltage generating circuit that generates a reference voltage VMID; a comparing circuit that compares a voltage appearing in the calibration terminal ZQ with the reference voltage VMID; an impedance adjusting circuit that changes an output impedance of the replica buffer based on a result of comparison carried out by the comparing circuit; and a reference voltage adjusting circuit that adjusts the reference voltage VMID. With this arrangement, the reference voltage VMID can be offset by taking into account a resistance component present between the calibration terminal ZQ and the external terminal, and therefore, a more accurate calibration operation can be carried out.

19 Claims, 13 Drawing Sheets

CALIBRATION CIRCUIT, SEMICONDUCTOR DEVICE INCLUDING THE SAME, AND METHOD OF ADJUSTING OUTPUT CHARACTERISTICS OF SEMICONDUCTOR DEVICE

TECHNICAL FIELD

The present invention relates to a calibration circuit and a semiconductor device including the same, and, more particularly to a calibration circuit that adjusts an output impedance of an output buffer, and a semiconductor device including the calibration circuit. The present invention also relates to a method of adjusting output characteristics of a semiconductor device, and, more particularly to an output-characteristic adjusting method of adjusting an output impedance of an output buffer. The present invention also relates to a data processing system that includes a semiconductor memory device having a calibration circuit.

BACKGROUND OF THE INVENTION

In recent years, significantly high data transfer rate is required for data transfer between semiconductor devices (between CPUs and memories for example). To accomplish high data transfer rate, the amplitude of input/output signals is increasingly reduced. If the input/output signals have reduced amplitudes, the desired accuracy of impedances of output buffers becomes severe.

The impedance of the output buffer varies depending on process conditions during the manufacturing. Also, during its actual use, the impedance of the output buffer is affected by variations in ambient temperature and power source voltage. When high impedance accuracy is required for the output buffer, output buffers that can adjust their impedances are utilized (Japanese Patent Application Laid-open Nos. 2002-152032, 2004-32070, 2006-203405, and 2005-159702). The impedance of such an output buffer is adjusted by circuits generally called "calibration circuits".

As disclosed in Japanese Patent Application Laid-open Nos. 2006-203405, and 2005-159702, the calibration circuit includes a replica buffer with the same configuration as the output buffer. When a calibration operation is performed, with an external resistor connected to a calibration terminal, the voltage of the calibration terminal is compared to the reference voltage and the impedance of the replica buffer is adjusted accordingly. The result of adjustment of the replica buffer is then reflected in the output buffer, and the impedance of the output buffer is thus set to the desired value.

As described above, in the calibration operation, a voltage appearing in the calibration terminal on the chip is compared with the reference voltage. However, the external resistor used in the calibration operation is connected to the external terminal on the package. Therefore, the impedance of the replica buffer does not necessarily coincide with the impedance of the external resistor. In other words, a certain level of resistance component is present between the calibration terminal on the chip and the external terminal on the package. Therefore, the impedance of the replica buffer is slightly deviated from a desired value, because the sum of the resistance value of the external resistor and the resistance component on the package becomes a target value.

SUMMARY OF THE INVENTION

The present invention has been achieved to solve the above problems, and an object of the present invention is to provide a calibration circuit that can carry out a more accurate calibration operation and a semiconductor device including this calibration circuit.

It is another object of the present invention to provide a method of adjusting output characteristics of a semiconductor device capable of accurately adjusting an impedance of the output buffer, based on the calibration operation.

The above and other objects of the present invention can be accomplished by a calibration circuit comprising:
a replica buffer connected to a calibration terminal;
a reference voltage generating circuit that outputs a reference voltage;
a comparing circuit that compares a voltage at the calibration terminal with the reference voltage;
an impedance adjusting circuit that changes an impedance of the replica buffer based on an output of the comparing circuit; and
a reference voltage adjusting circuit that can change a level of the reference voltage outputted from the reference voltage generating circuit.

The above and other objects of the present invention can also be accomplished by a semiconductor device including: a data output terminal; a calibration terminal; an output buffer connected to the data output terminal; and a calibration circuit having the above described configuration, wherein a part of the output buffer has the same circuit configuration as that of the replica buffer. It is worth noting that the data output terminal can include a data input/output terminal.

The above and other objects of the present invention can also be accomplished by an output-characteristic adjusting method of a semiconductor device, the output-characteristic adjusting method comprising: a first step of adjusting an impedance of the replica buffer; a second step of measuring an impedance of the replica buffer; and a third step of adjusting the reference voltage based on the impedance of the replica buffer.

In the present invention, while the method of adjusting the reference voltage by the reference voltage adjusting circuit is not particularly specified, it is preferable that the reference voltage generating circuit generates plural reference voltages of which levels are mutually different and that the reference voltage adjusting circuit selects one of these reference voltages. In this case, it is preferable that the reference voltage adjusting circuit includes a nonvolatile memory element to maintain a selection state.

While the kind of a nonvolatile memory element is not particularly limited, it is preferable to use an electrically writable element. The electrically writable element includes an antifuse.

While the configuration of the reference voltage generating circuit is not particularly limited, the reference voltage generating circuit preferably includes a high-resistance part and a low-resistance part. In this case, plural reference voltages are preferably taken out from the low-resistance part. A diffusion layer resistor can be used for the high-resistance part, and a wiring resistor can be used for the low-resistance part.

As explained above, according to the present invention, the reference voltage can be adjusted. Therefore, the reference voltage can be offset by considering the resistance component present between the calibration terminal and the external terminal. Accordingly, the impedance of the replica buffer can be set to a value considering the resistance component on the package, and a more accurate calibration operation can be carried out.

Further, by carrying out the accurate calibration operation, the data transfer speed on the system can be increased, and a higher-speed data processing system can be configured.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
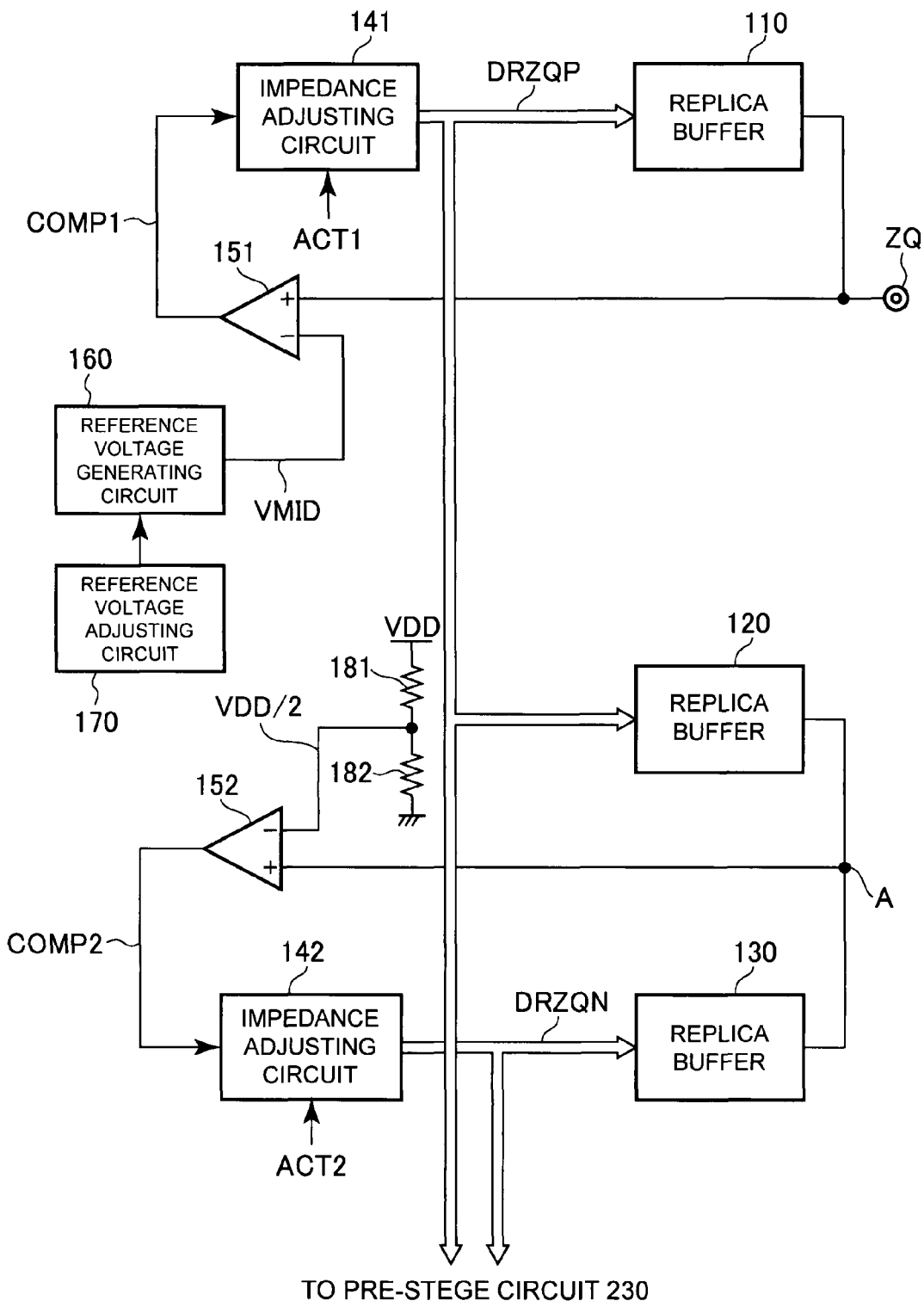
FIG. 1 is a circuit diagram of a calibration circuit according to a preferred embodiment of the present invention.

FIG. 1 is a circuit diagram of a calibration circuit 100 according to a preferred embodiment of the present invention.

As shown in FIG. 1, the calibration circuit 100 of the present embodiment includes replica buffers 110, 120, and 130, an impedance adjusting circuit 141 for controlling the impedances of the replica buffers 110 and 120, a impedance adjusting circuit 142 for controlling the impedance of the replica buffer 130, a comparator 151 for controlling the impedance adjusting circuit 141, and a comparator 152 for controlling the impedance adjusting circuit 142.

The replica buffers 110, 120, and 130 have the same circuit configuration as a part of an output buffer which will be described later. The output impedance is adjusted by using the replica buffers 110, 120, and 130 and the result is reflected in the output buffer. The impedance of the output buffer is thus set to the desired value. That is the function of the calibration circuit 100.

Figure 2:
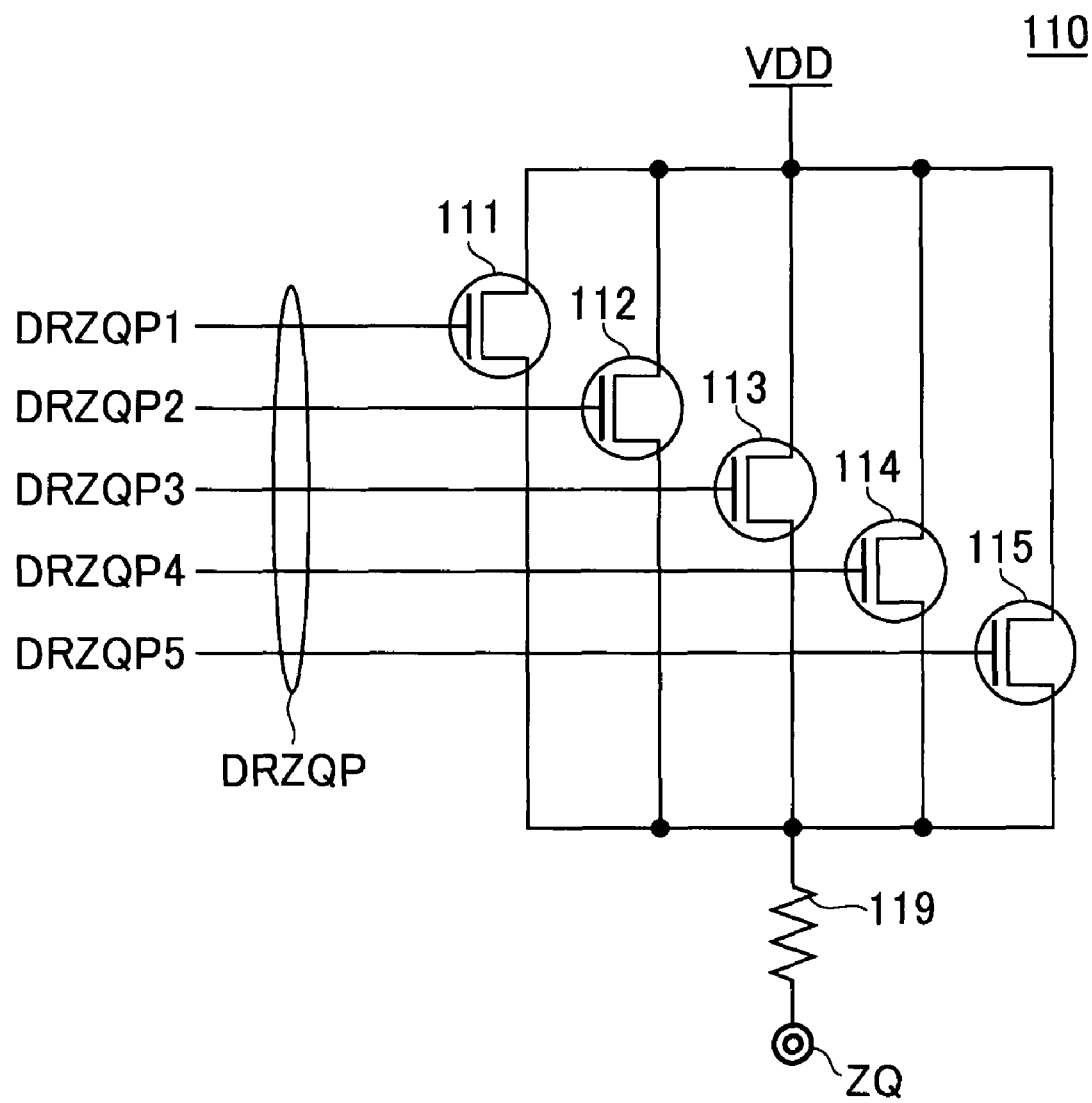
FIG. 2 is a circuit diagram of the replica buffer of pull-up side shown in FIG. 1.

FIG. 2 is a circuit diagram of the replica buffer 110.

As shown in FIG. 2, the replica buffer 110 is formed by five P-channel MOS transistors 111 to 115 connected in parallel to a power source potential VDD and a resistor 119 with its one end being connected to the drains of the transistors. The other end of the resistor 119 is connected to a calibration terminal ZQ. The replica buffer 110 does not have a pull-down function. Instead, this buffer has only a pull-up function.

Impedance control signals DRZQP1 to DRZQP5 are provided to the gates of the transistors 111 to 115 from the impedance adjusting circuit 141. Five transistors in the replica buffer 110 perform on-off controls separately. In FIGS. 1 and 2, the impedance control signals DRZQP1 to DRZQP5 are collectively referred to as DRZQP.

The parallel circuit of the transistors 111 to 115 is designed so as to have predetermined impedance (e.g., 120Ω) in active state. Hoverer, because the on-resistance of the transistor varies depending on manufacturing conditions, environmental temperatures, and power source voltages during the operation, the desired impedance may not be obtained. To accomplish 120Ω of the impedance actually, the number of transistors to be turned on must be adjusted. The parallel circuit of a plurality of transistors is thus utilized.

To adjust the impedance closely over a wide range, W/L ratios (ratios of gate width to gate length) of the plurality of transistors constituting the parallel circuit are preferably different from one another. More preferably, a power of two weighting is performed upon the transistors. In view of this point, according to the present embodiment, when the W/L ratio of the transistor 111 is set to "1", the W/L ratios of the transistors 112 to 115 are "2", "4", "8", and "16", respectively (these W/L ratios do not represent actual W/L ratios but relative values, which will also apply to the following description.).

By selecting appropriately transistors to be turned on by the impedance control signals DRZQP1 to DRZQP5, the on resistance of the parallel circuit is fixed to about 120Ω regardless of variations in the manufacturing conditions and the temperature changes.

The resistance value of the resistor 119 is designed to be 120Ω, for example. Therefore, when the parallel circuits of the transistors 111 to 115 are turned on, the impedance of the replica buffer 110 is 240Ω as seen from the calibration terminal ZQ. For example, a tungsten (W) resistor is utilized for the resistor 119.

The replica buffer 120 has the same circuit configuration as the replica buffer 110 shown in FIG. 2 except that the other end of the resistor 119 is connected to a node A. Therefore, the impedance control signals DRZQP1 to DRZQP5 are provided to the gates of five transistors in the replica buffer 120.

Figure 3:
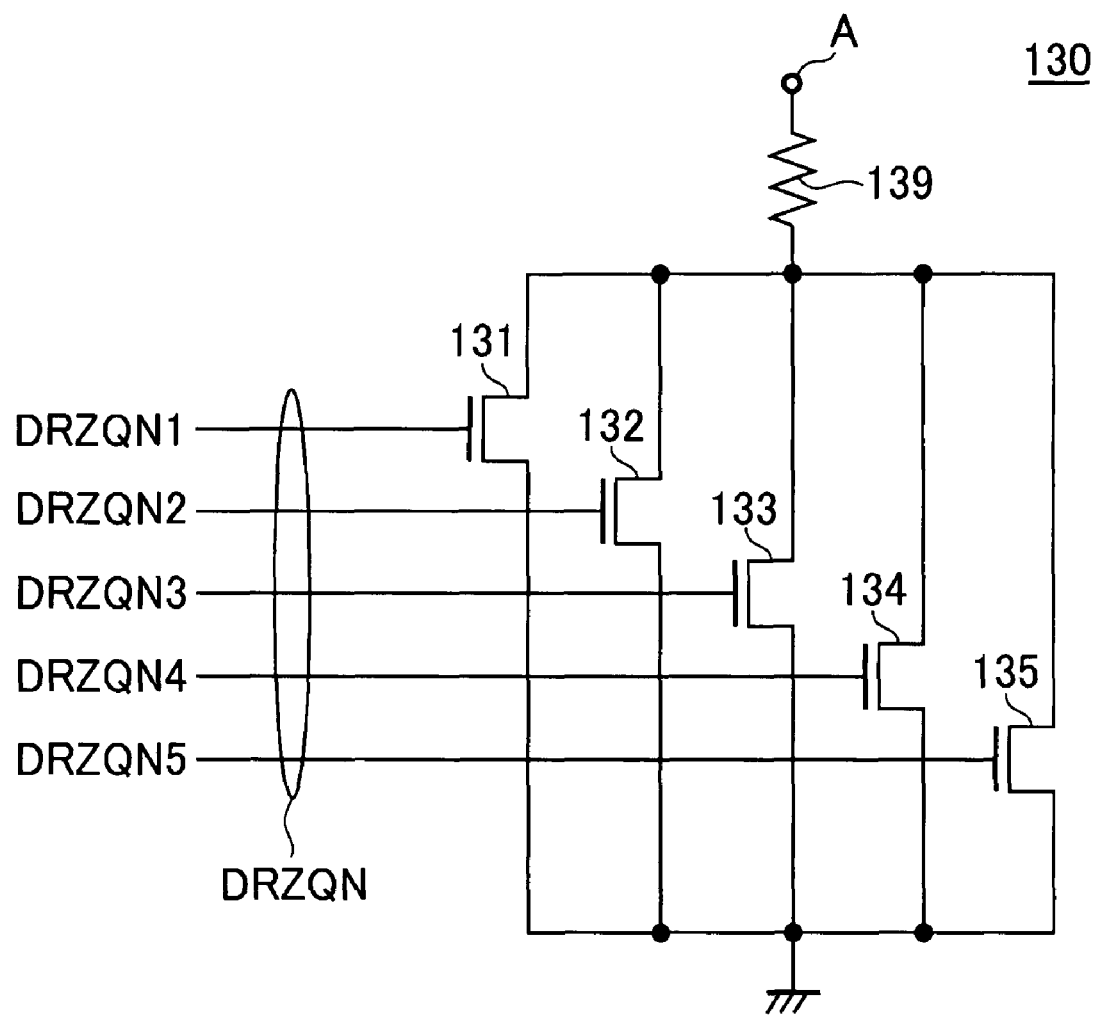
FIG. 3 is a circuit diagram of the replica buffer of pull-down side shown in FIG. 1.

FIG. 3 is a circuit diagram of the replica buffer 130.

As shown in FIG. 3, the replica buffer 130 is formed by five N-channel MOS transistors 131 to 135 connected in parallel to a ground potential and a resistor 139 with its one end being connected to the drains of the transistors. The other end of the resistor 139 is connected to the node A. The replica buffer 130 does not have the pull-up function. Instead, this buffer has only the pull-down function.

Impedance control signals DRZQN1 to DRZQN5 are provided to the gates of the transistors 131 to 135 from the impedance adjusting circuit 142. Therefore, five transistors in the replica buffer 130 perform on-off controls separately. In FIGS. 1 and 3, the impedance control signals DRZQN1 to DRZQN5 are collectively referred to as DRZQN.

The parallel circuit of the transistors 131 to 135 is designed to have e.g., 120Ω at the time of conduction. The resistance value of the resistor 139 is designed to be e.g., 120Ω. When the parallel circuit of the transistors 131 to 135 is turned on, the impedance of the replica buffer 130 is, as seen from the node A, 240Ω like the replica buffers 110 and 120.

More preferably, like the transistors 111 to 115, the power of two weighting is performed upon the W/L ratios of the transistors 131 to 135. Specifically, when the W/L ratio of the transistor 131 is "1", the W/L ratios of the transistors 132 to 135 are set to "2", "4", "8", and "16", respectively.

Referring back to FIG. 1, the impedance adjusting circuit 141 has a counter function of counting up or counting down when a control signal ACT1 becomes active. Specifically, the impedance adjusting circuit 141 continues a count-up operation when a comparison signal COMP1 as the output of a comparing circuit 151 is at the high level, and continues a countdown operation when the comparison signal COMP1 is at the low level.

A non-inverting input terminal (+) of the comparing circuit 151 is connected to the calibration terminal ZQ, and an inverting input terminal (−) is connected to a reference voltage generating circuit 160. A reference voltage generating circuit 160 is a circuit that generates a reference voltage VMID which is approximately a half of a power source voltage (VDD−VSS). As described later, a reference voltage adjusting circuit 170 can fine adjust a level of the reference voltage VMID.

Accordingly, the comparing circuit 151 compares the potential of the calibration terminal ZQ with the reference voltage VMID. The comparing circuit 151 sets the output comparison signal COMP1 to the high level when the potential of the calibration terminal ZQ is higher, and sets the comparison signal COMP1 to the low level when the reference voltage VMID is higher.

On the other hand, the impedance adjusting circuit 142 has a counter function of counting up or counting down when a control signal ACT2 becomes active. Specifically, the impedance adjusting circuit 142 continues a count-up operation when a comparison signal COMP2 as the output of a comparing circuit 152 is at the high level, and continues a countdown operation when the comparison signal COMP2 is at the low level.

A non-inverting input terminal (+) of the comparing circuit 152 is connected to the node A that is the output ends of the replica buffers 120 and 130, and an inverting input terminal (−) is connected to a middle point of resistors 181 and 182 connected between the power source potential (VDD) and the ground potential (VSS). Based on this configuration, the comparing circuit 152 compares the voltage of the node A with an intermediate voltage (VDD/2). The comparing circuit 152 sets the output comparison signal COMP2 to the high level when the voltage of the node A is higher, and sets the comparison signal COMP2 to the low level when the intermediate voltage (VDD/2) is higher.

The impedance adjusting circuits 141 and 142 stop the count operation when the control signals ACT1 and ACT2 become inactive, and hold the current count value. As described above, the count value of the impedance adjusting circuit 141 is used as the impedance control signal DRZQP, and the count value of the impedance adjusting circuit 142 is used as the impedance control signal DRZQN.

Figure 4:
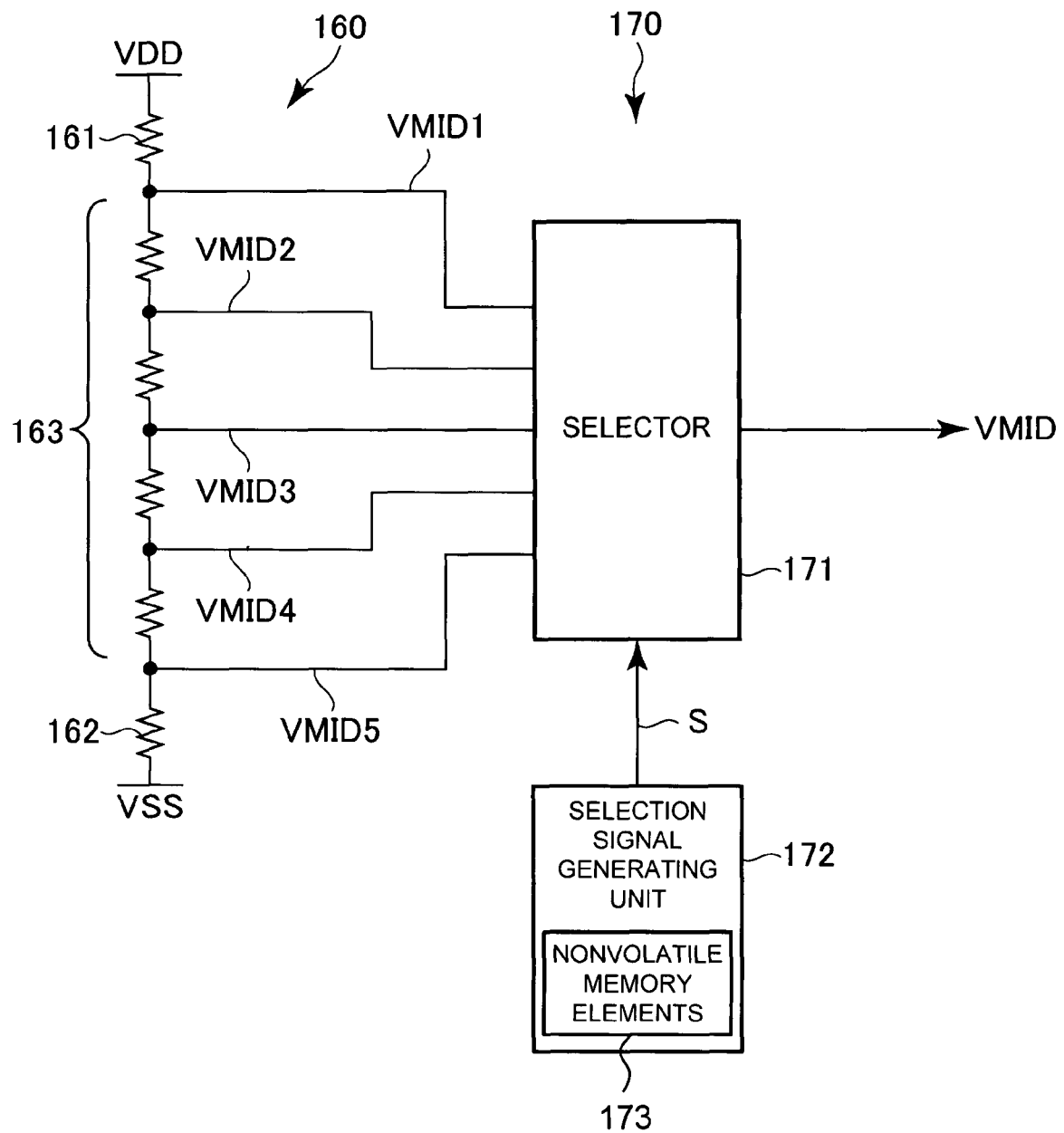
FIG. 4 is a circuit diagram of the reference voltage generating circuit and the reference voltage adjusting circuit shown in FIG. 1.

FIG. 4 is a circuit diagram of the reference voltage generating circuit 160 and the reference voltage adjusting circuit 170.

As shown in FIG. 4, the reference voltage generating circuit 160 includes plural resistors 161 to 163 that are connected between the power source potential VDD and the ground potential VSS in series. Reference voltages VMID1 to VMID5 are taken out from between the resistors. Therefore, the reference voltage generating circuit 160 generates plural reference voltages having mutually different levels.

Out of the resistors 161 to 163, the resistor 161 connected to the power source potential VDD and the resistor 162 connected to the ground potential VSS have mutually high resistances. On the other hand, the resistor 163 connected between the resistor 161 and the resistor 162 has a relatively low resistance. The plural reference voltages VMID1 to VMID5 are taken out from a low resistance part including the resistor 163, to decrease a voltage difference among the plural reference voltages VMID1 to VMID5. Although there is no particular limit, the high resistance part including the resistors 161 and 162 preferably uses a diffusion layer resistor, and the low resistance part including the resistor 163 preferably uses a wiring resistor such as tungsten (W).

On the other hand, the reference voltage adjusting circuit 170 includes a selector 171 and a selection signal generating unit 172. The selector 171 is a circuit that receives the reference voltages VMID1 to VMID5 generated by the reference voltage generating circuit 160. The selector 171 outputs one of the reference voltages selected based on a selection signal S from the selection signal generating unit 172.

A write processing is carried out to the selection signal generating unit 172 during the manufacture or after the manufacture of the selection signal generating unit 172. It is preferable that the selection signal generating unit 172 includes a nonvolatile memory elements 173 to hold the content of the selection signal S after the write processing is carried out. Although a kind of the nonvolatile memory elements 173 is not particularly limited, it is preferable that an electrically writable element is used. The electrically writable element includes an antifuse, for example. In the initial state (a state before the adjustment operation of the reference voltage described later is carried out), a voltage nearest to the intermediate voltage (VDD/2) is selected from among the reference voltages VMID1 to VMID5.

The configuration of the calibration circuit 100 according to the present embodiment has been described.

Figure 5:
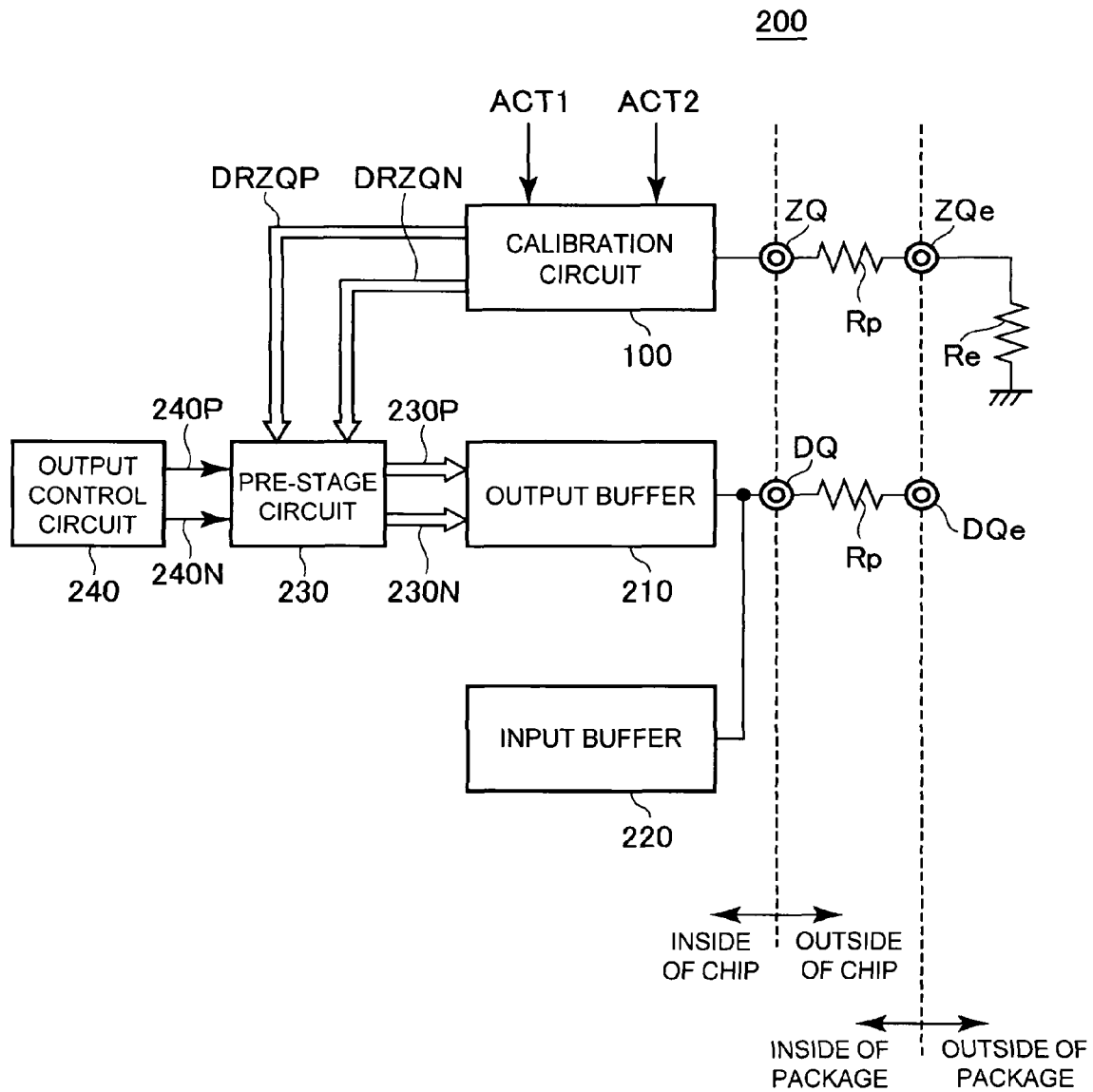
FIG. 5 is a block diagram of main parts of a semiconductor device that includes the calibration circuit shown in FIG. 1.

FIG. 5 is a block diagram of main parts of a semiconductor device 200 that includes the calibration circuit 100.

The semiconductor device 200 shown in FIG. 5 includes, in addition to the calibration circuit 100, an output buffer 210 and input buffer 220 that are connected to a data input/output terminal DQ. Since the configuration of the input buffer 220 is not directly relevant to the scope of the present invention, its description will be omitted in the specification.

The operation of the output buffer 210 is controlled by operation signals 230P and 230N provided from a pre-stage circuit 230. As shown in FIG. 5, the impedance control signals DRZQP and DRZQN provided from the calibration circuit 100 are provided to the pre-stage circuit 230.

Figure 6:
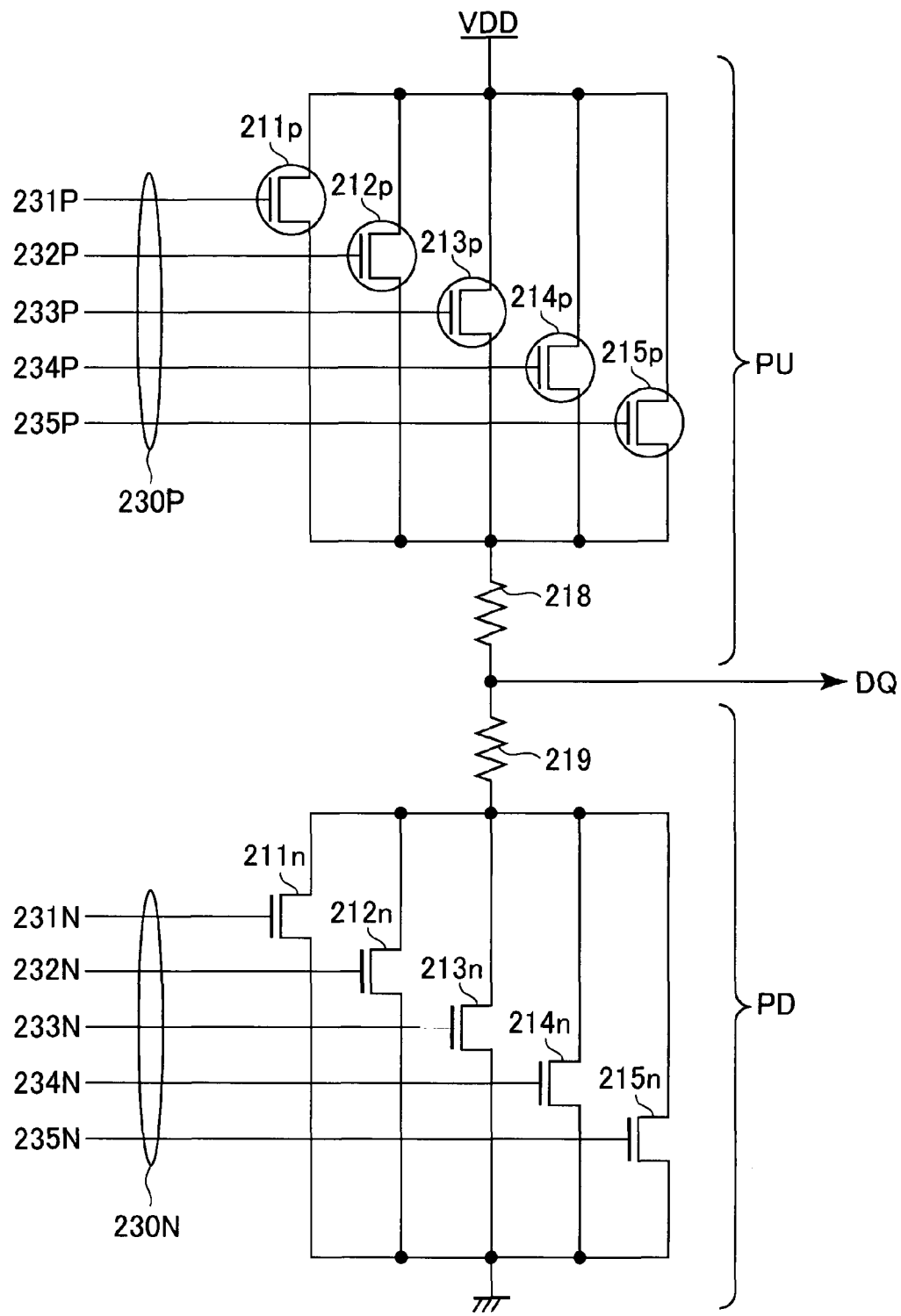
FIG. 6 is a circuit diagram of the output buffer shown in FIG. 5.

FIG. 6 is a circuit diagram of the output buffer 210.

As shown in FIG. 6, the output buffer 210 includes five P-channel MOS transistors 211p to 215p connected in parallel and five N-channel MOS transistors 211n to 215n connected in parallel. Resistors 218 and 219 are serially connected between the transistors 211p to 215p and the transistors 211n to 215n. The connection point of the resistor 218 and the resistor 219 is connected to the data input/output terminal DQ.

Five operation signals 231P to 235P that constitute an operation signal 230P are provided to the gates of the transistors 211p to 215p. Five operation signals 231N to 235N that constitute an operation signal 230N are provided to the gates of the transistors 211n to 215n. Ten transistors in the output buffer 210 are on-off controlled separately by ten operation signals 231P to 235P and 231N to 235N. The operation signals 231P to 235P constitute the operation signal 230P, and the operation signals 231N to 235N constitute the operation signal 230N.

In the output buffer 210, a pull-up circuit PU formed by the P-channel MOS transistors 211p to 215p and the resistor 218 has the same circuit configuration as the replica buffer 110 (120) shown in FIG. 2. A pull-down circuit PD formed by the N-channel MOS transistors 211n to 215n and the resistor 219 has the same circuit configuration as the replica buffer 130 shown in FIG. 3.

Accordingly, the parallel circuit of the transistors 211p to 215p and the parallel circuit of the transistors 211n to 215n are designed to have e.g., 120Ω at the time of conduction. Resistance values of the resistors 218 and 219 are designed to be, e.g., 120Ω, respectively. Therefore, if either the parallel circuit of the transistors 211p to 215p or the parallel circuit of the transistors 211n to 215n is turned on, the impedance of the output buffer is 240Ω as seen from the data input/output terminal DQ.

In actual semiconductor devices, a plurality of these output buffers 210 are provided in parallel and the output impedance is selected depending on the number of output buffers to be used. Assume that the impedance of the output buffer is indicated by X, by using Y output buffers in parallel, the output impedance is calculated as X/Y.

Figure 7:
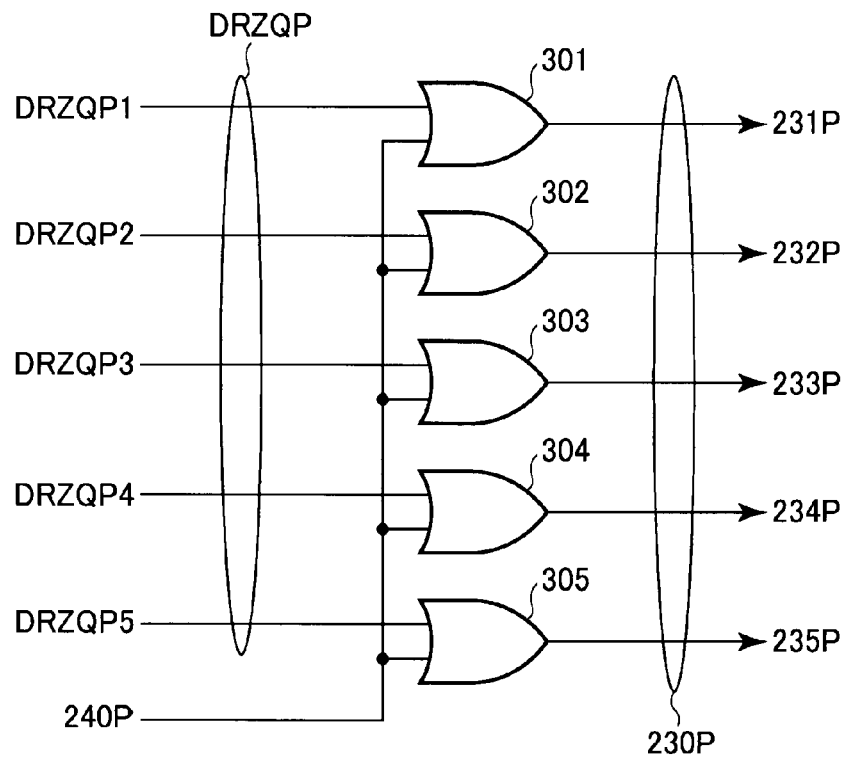
FIG. 7 is a circuit diagram of the pre-stage circuit shown in FIG. 5.
Figure 7:
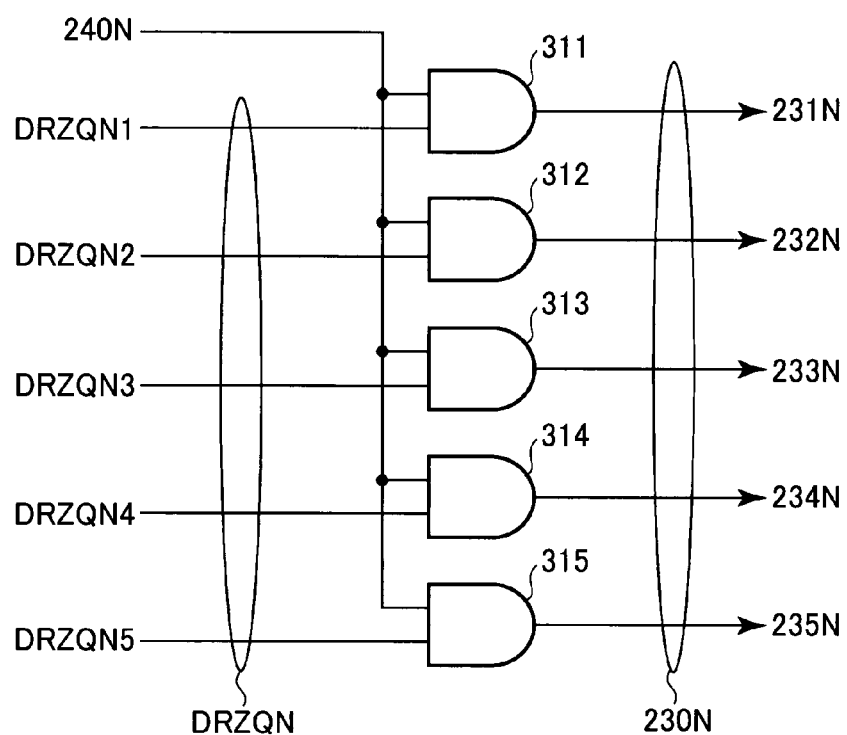

FIG. 7 is a circuit diagram of the pre-stage circuit 230.

As shown in FIG. 7, the pre-stage circuit 230 is formed by five OR circuits 301 to 305 and five AND circuits 311 to 315. A selection signal 240P from an output control circuit 240 and the impedance control signals DRZQP1 to DRZQP5 from the calibration circuit 100 are provided to the OR circuits 301 to 305. Meanwhile, a selection signal 240N from the output control circuit 240 and the impedance control signals DRZQN1 to DRZQN5 from the calibration circuit 100 are provided to the AND circuits 311 to 315.

The selection signals 240P and 240N that are the outputs of the output control circuit 240 are controlled depending on logic values of data to be outputted from the data input/output terminal DQ. Specifically, when a high level signal is outputted from the data input/output terminal DQ, the selection signals 240P and 240N are set to low level. When a low level signal is outputted from the data input/output terminal DQ, the selection signals 240P and 240N are set to high level. When ODT (On Die Termination) that the output buffer 210 is used as a terminal resistor is utilized, the selection signal 240P is set to low level and the selection signal 240N is set to high level.

Operation signals 231P to 235P (=230P) that are the outputs of the OR circuits 301 to 305 and the operation signals 231N to 235N (=230N) that are the outputs of the AND circuits 311 to 315 are provided to the output buffer 210 as shown in FIG. 5.

The above explains the configuration of the semiconductor device 200. Next, the operation of the calibration circuit 100 according to the present embodiment is explained in the order of the adjustment operation of the reference voltage and the calibration operation.

The adjustment operation of the reference voltage is explained first.

The adjustment operation of the reference voltage is carried out in a state that an external resistor Re is connected to the calibration terminal ZQ, as shown in FIG. 5, after the chip is packaged. The impedance of the external resistor Re is a set target value of the replica buffer 110, and the resistance of 240Ω is used in the above example. However, the external resistor Re is not directly connected to the calibration terminal ZQ on the chip, and is connected to an external terminal ZQe on the package.

Therefore, a resistance value observed from the calibration terminal ZQ on the chip becomes a combined value of the external resistor Re and a resistor Rp on the package (=Re+Rp). For example, when the resistor Rp on the package is 1Ω, resistance of 241Ω is connected to the calibration terminal ZQ.

Therefore, when the calibration operation is carried out in this state, the impedance of the replica buffer 110 is adjusted to Re+Rp (=241Ω). As described later, in the calibration operation, the impedance of the replica buffer 110 is set first, and the impedance of the replica buffer 130 is set based on this impedance. These setting states are reflected to the output buffer 210. Therefore, when the impedance of the replica buffer 110 is inaccurate, the impedances of a pull-up circuit PU and a pull-down circuit PD that constitute the output buffer 210 also become inaccurate.

The deviation of the impedances can be solved by carrying out the adjustment operation of the reference voltage.

Figure 8:
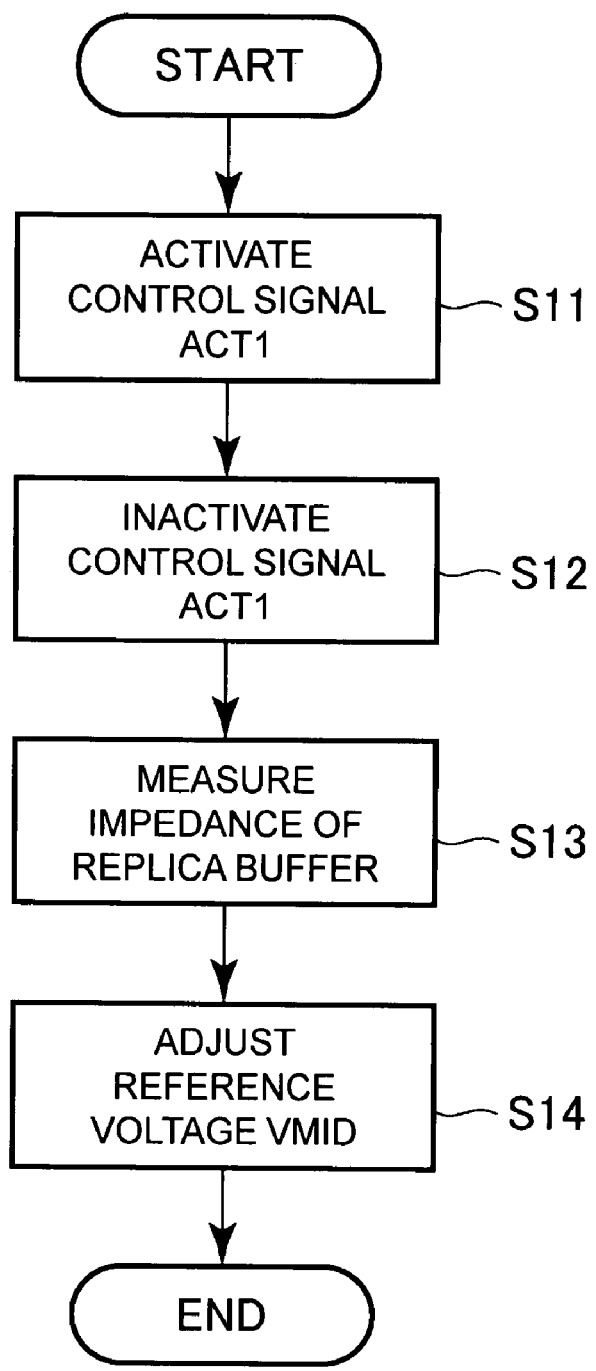
FIG. 8 is a flowchart for explaining the adjustment operation of the reference voltage.

FIG. 8 is a flowchart for explaining the adjustment operation of the reference voltage.

In the adjustment operation of the reference voltage, the control signal ACT1 is activated, and the count operation of the impedance adjusting circuit 141 included in the calibration circuit 100 is started (step S11). In the initial state after the power source is turned on, the count value of the impedance adjusting circuit 141 is reset to all one (in the present example, "11111"), for example. Therefore, the impedance control signals DRZQP1 to DRZQP5 as the outputs of the impedance adjusting circuit 141 are all at the high level. Consequently, the transistors 111 to 115 included in the replica buffer 110 all become in the off state. As a result, the comparison signal COMP1 as the output of the comparing circuit 151 becomes at the low level.

Therefore, the impedance adjusting circuit 141 proceeds with the countdown operation, and the on/off states of the transistors 111 to 115 are changed over linked to the countdown. Specifically, because the W/L ratios of the transistors 111 to 115 are set to "1", "2", "4", "8", and "16", respectively, a least significant bit (LSB) becomes the impedance control signal DRZQP1, and a most significant bit (MSB) becomes the impedance control signal DRZQP5, out of the outputs of the impedance adjusting circuit 141. As a result, the impedance of the replica buffer 110 can be changed in the smallest pitch.

Figure 9:
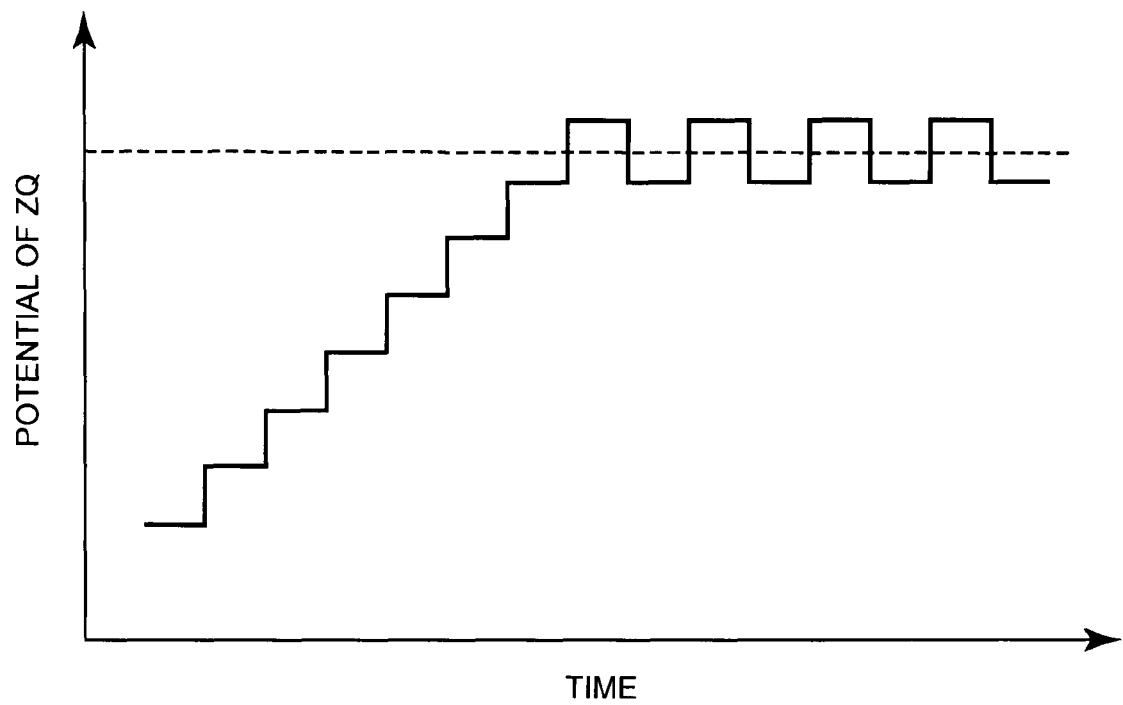
FIG. 9 is a graph showing one example of potential change at the calibration terminal.

When the countdown is proceeded with, the impedance of the replica buffer 110 gradually decreases, and the potential of the calibration terminal ZQ gradually increases, as shown in FIG. 9. When the impedance of the replica buffer 110 decreases to a level less than the impedance Re (to be exactly, Re+Rp) as the target of the impedance of the replica buffer 110, the potential of the calibration terminal ZQ exceeds a reference voltage VMID. Therefore, the comparison signal COMP1 as the output of the comparing circuit 151 is inverted to the high level. In response to this, the impedance adjusting circuit 141 proceeds with the count-up operation, thereby increasing the impedance of the replica buffer 110.

When the above operation is repeated, the potential of the calibration terminal ZQ is stabilized near the reference voltage VMID. Thereafter, the control signal ACT1 is inactivated, and the account operation of the impedance adjusting circuit 141 is stopped (step S12). As a result, the account value of the impedance adjusting circuit 141 is fixed, and the levels of the impedance control signals DRZQP1 to DRZQP5 become firm.

The adjustment of the impedance of the replica buffer 110 ends, after finishing the above operation.

Next, the actual impedance of the replica buffer 110 is measured using a tester (step S13). The current impedance of the replica buffer 110 must be equal to the sum (=Re+Rp) of resistances of the external resister Re and the resister Rp on the package, and is 241Ω in the above example. Therefore, the impedance of the replica buffer 110 observed from the external terminal ZQe becomes Re+2Rp, and becomes 242Ω in the above example. Originally, it is required that the impedance of the replica buffer 110 observed from the external terminal ZQe coincides with the external resistance Re (=240Ω).

In order to correct the above deviation, the reference voltage adjusting circuit 170 is used to adjust the reference voltage VMID (step S14). When the impedance measured at step S13 is higher than a target value, the reference voltage VMID is adjusted to be offset at a high value. As described above, the reference voltage adjusting circuit 170 includes the selector 171 and the selection signal generating unit 172. Therefore, a predetermined write processing is carried out to the selection signal generating unit 172, based on the impedance measured at step S13.

Because the selection signal S changes based on the above operation, the selector 171 changes over the selection of the reference voltages VMID1 to VMID5 according to the selection signal S. For example, when the reference voltage VMID3 is selected in the initial state, the reference voltage VMID1 or VMID2 of a higher voltage is selected. Specifically, any one of the reference voltages can be selected, by providing a table showing a relationship between the deviation amount of the impedance and the reference voltage to be selected, at the tester side, and by referring to this table. According to this method, the adjustment of the reference voltage can be completed at a high speed.

Alternatively, it is only determined whether the impedance measured at step S13 is higher than the target value, and the selection of the reference voltage is changed over by one stage based on this determination. This operation is repeated by plural number of times, thereby specifying the reference voltage to be finally selected. According to this method, the reference voltage can be adjusted more accurately, although the adjustment takes time.

The adjustment operation of the reference voltage is as described above. When the adjustment operation of the reference voltage is completed, the reference voltage VMID becomes in the state offset from the intermediate voltage (VDD/2).

Next, the calibration operation is explained. The calibration operation is executed when the calibration operation is not instructed, after the above adjustment operation of the reference voltage is carried out.

Figure 10:
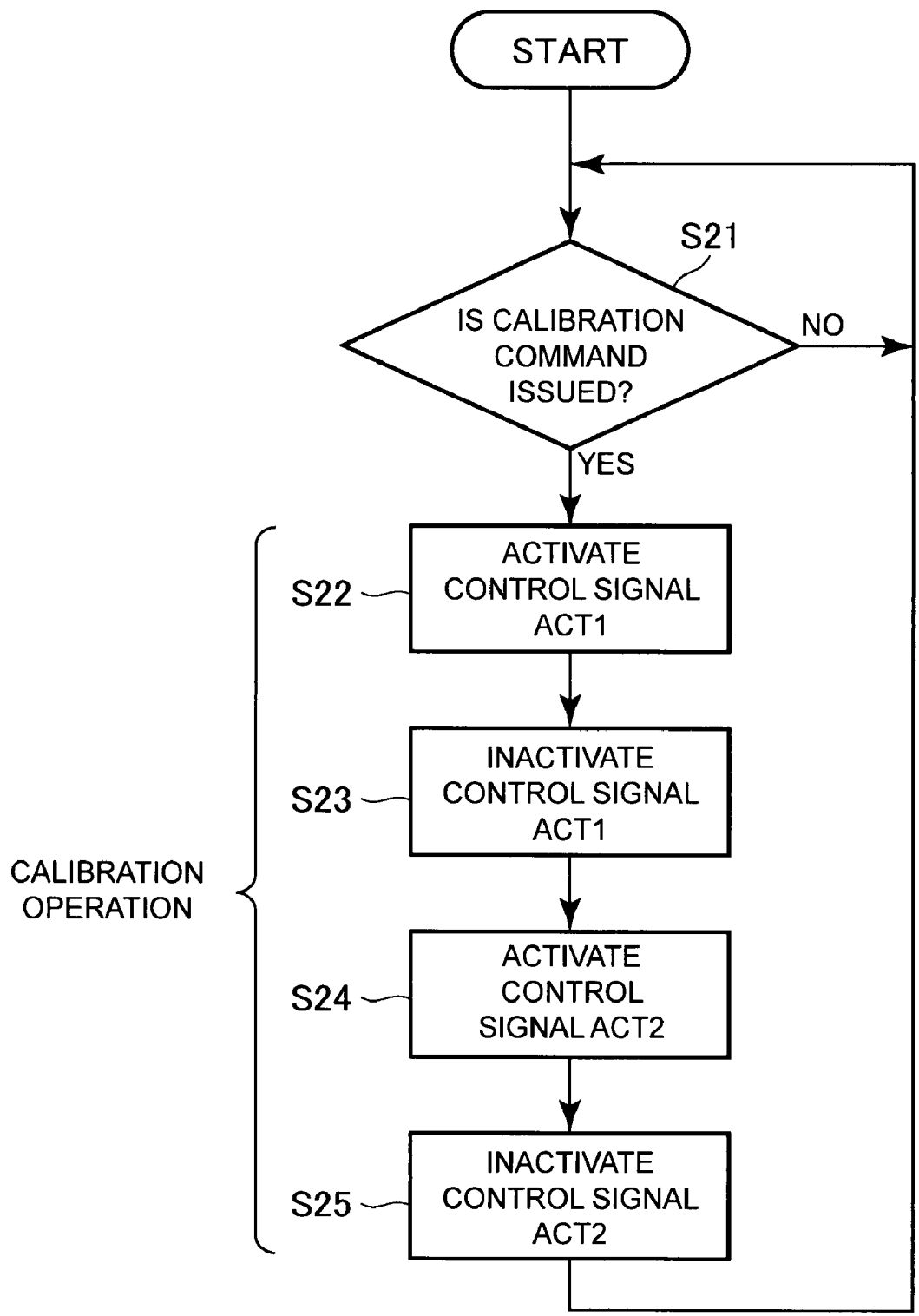
FIG. 10 is a flowchart for explaining the calibration operation.

FIG. 10 is a flowchart for explaining the calibration operation.

When the calibration operation is instructed by an external command (step S21: YES), the control signal ACT1 is activated to start the count operation of the impedance adjusting circuit 141 (step S22). Thereafter, the control signal ACT1 is inactivated to stop the count operation of the impedance adjusting circuit 141 (step S23). This operation is the same as the adjustment operation of the reference voltage at steps S11 and S12. As a result, the count value as the output of the impedance adjusting circuit 141 is fixed, and the levels of the impedance control signals DRZQP1 to DRZQP5 are firmed.

In this case, the reference voltage VMID to be supplied to the inverting input terminal (−) of the comparing circuit 151 is a voltage slightly higher than the level offset by the adjustment operation of the reference voltage, for example, the intermediate voltage (VDD/2). In this case, the impedance target value of the replica buffer 110 becomes a value slightly lower than the resistance of the external resistor Re. Therefore, when the reference voltage VMID is offset so that the impedance target value of the replica buffer 110 becomes Re−Rp, the impedance of the replica buffer 110 observed from the external terminal ZQe substantially coincides with the impedance of the external resister Re.

In the above example, when the reference voltage VMID is offset so that the impedance of the replica buffer 110 becomes 239Ω, the impedance of the replica buffer 110 observed from the external terminal ZQe accurately becomes 240Ω (=239Ω+1Ω). The added 1Ω corresponds to the resistance Rp on the package.

As shown in FIG. 1, because the impedance control signals DRZQP1 to DRZQP5 are also supplied to the replica buffer 120, the impedance of the replica buffer 120 is also set to the same value.

Next, the control signal ACT2 is activated, and the count operation of the impedance adjusting circuit 142 included in the calibration circuit 100 is started (step S24). In the initial state, the count value as the output of the impedance adjusting circuit 142 is reset to all zero, for example, (in the present example, the count value is reset to "00000"). Therefore, the impedance control signals DRZQN1 to DRZQN5 as the outputs of the impedance adjusting circuit 142 are all at the low level. Accordingly, the transistors 131 to 135 included in the replica buffer 130 all become in the off state. As a result, the comparing signal COMP2 as the output of the comparing circuit 152 becomes in the high level.

In response to the above, the impedance adjusting circuit 142 proceeds with the count-up, and the on/off states of the transistors 131 to 135 are changed over linked to the proceeding of the count-up. In this case, in response to the fact that the W/L ratios of the transistors 131 to 135 are set to "1", "2", "4", "8", and "16", respectively, the least significant (LSB) of the impedance adjusting circuit 142 is used as the impedance control signal DRZQN1, and the most significant bit (MSB) is used as the impedance control signal DRZQN5. Accordingly, the impedance of the replica buffer 130 can be changed in the minimum pitch.

Figure 11:
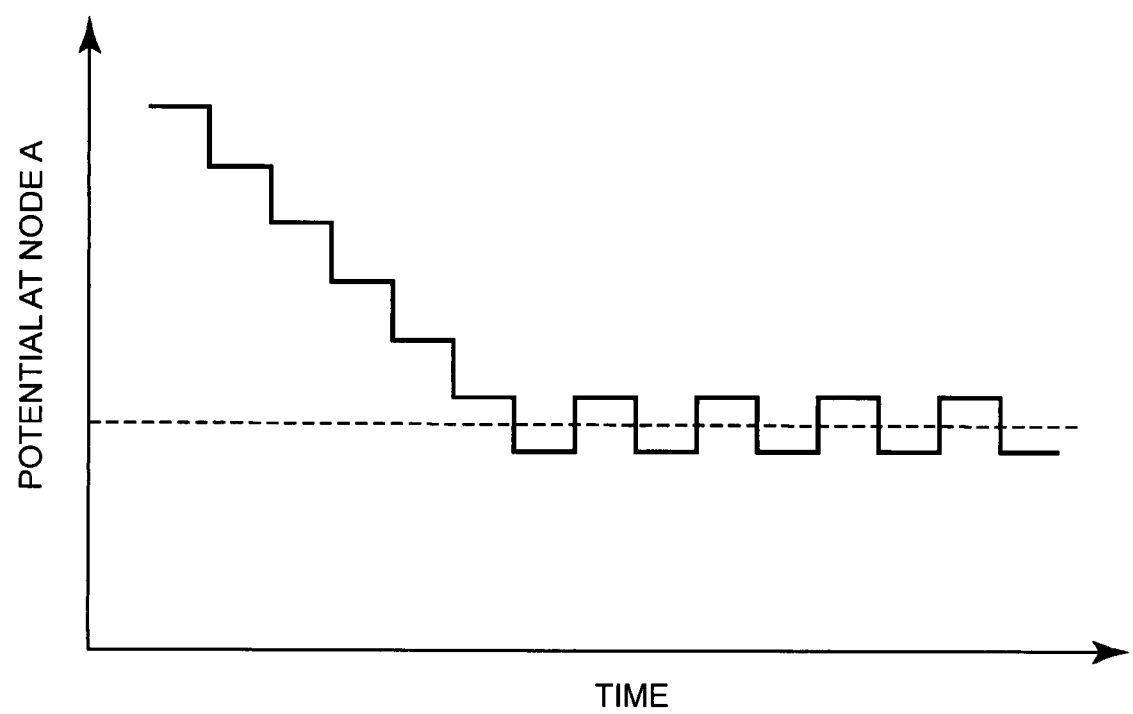
FIG. 11 is a graph showing one example of potential change at the node A shown in FIG. 1.

When the count-up operation is progressed, the impedance of the replica buffer 130 gradually decreases, and the potential of the node A gradually decreases, as shown in FIG. 11. When the impedance of the replica buffer 130 decreases to less than the target impedance (=Re−Rp), the potential of the node A becomes lower than the intermediate voltage (VDD/2). Therefore, the comparison signal COMP2 as the output of the comparing circuit 152 is inverted to the low level. In response to this, the impedance adjusting circuit 142 proceeds with the countdown, and increases the impedance of the replica buffer 130.

When the above operation is repeated, the potential of the node A is stabilized near the intermediate voltage (VDD/2). Thereafter, the control signal ACT2 is inactivated, and the count operation of the impedance adjusting circuit 142 is stopped (step S25). As a result, the count value as the output of the impedance adjusting circuit 142 is fixed, and the levels of the impedance control signals DRZQN1 to DRZQN5 are firmed.

Based on the above operation, the impedance of the replica buffer 130 can be also correctly adjusted to the target value.

Referring back to step S21, the instruction of the calibration operation based on the external command and the like is awaited. When the calibration operation is instructed (step S21: YES), the above series of operation are executed.

The above explains the calibration operation. The impedance control signals DRZQP and DRZQN firmed by the above calibration operation are supplied to a pre-stage circuit 230 shown in FIG. 5. Therefore, the set content of the replica buffer is also reflected in the output buffer 210 controlled by the pre-stage circuit 230.

As shown in FIG. 5, the similar resistance component Rp is present between the data input and output terminal DQ on the chip and the external terminal DQe on the package. Therefore, from the viewpoint of the external terminal DQe on the package, the output buffer 210 can be operated accurately in the desired impedance (for example, 240Ω).

As explained above, the calibration circuit 100 according to the present embodiment has the function of offsetting the reference voltage VMID used during the calibration operation. Therefore, the impedance can be adjusted to the accurate impedance taking the resistance Rp on the package into account.

The adjustment operation of the reference voltage does not need to be carried out for all the semiconductor devices 200. For other semiconductor devices using a package of the same specification, the adjustment operation of the reference voltage is not necessary, and the common content can be written to the selection signal generating unit 172.

While the reference voltage VMID to be supplied to the comparing circuit 151 is offset in the above embodiment, the reference voltage to be supplied to the comparing circuit 152 can be also offset. An embodiment in which the reference voltage to be supplied to the comparing circuit 152 can be offset is explained next.

Figure 12:
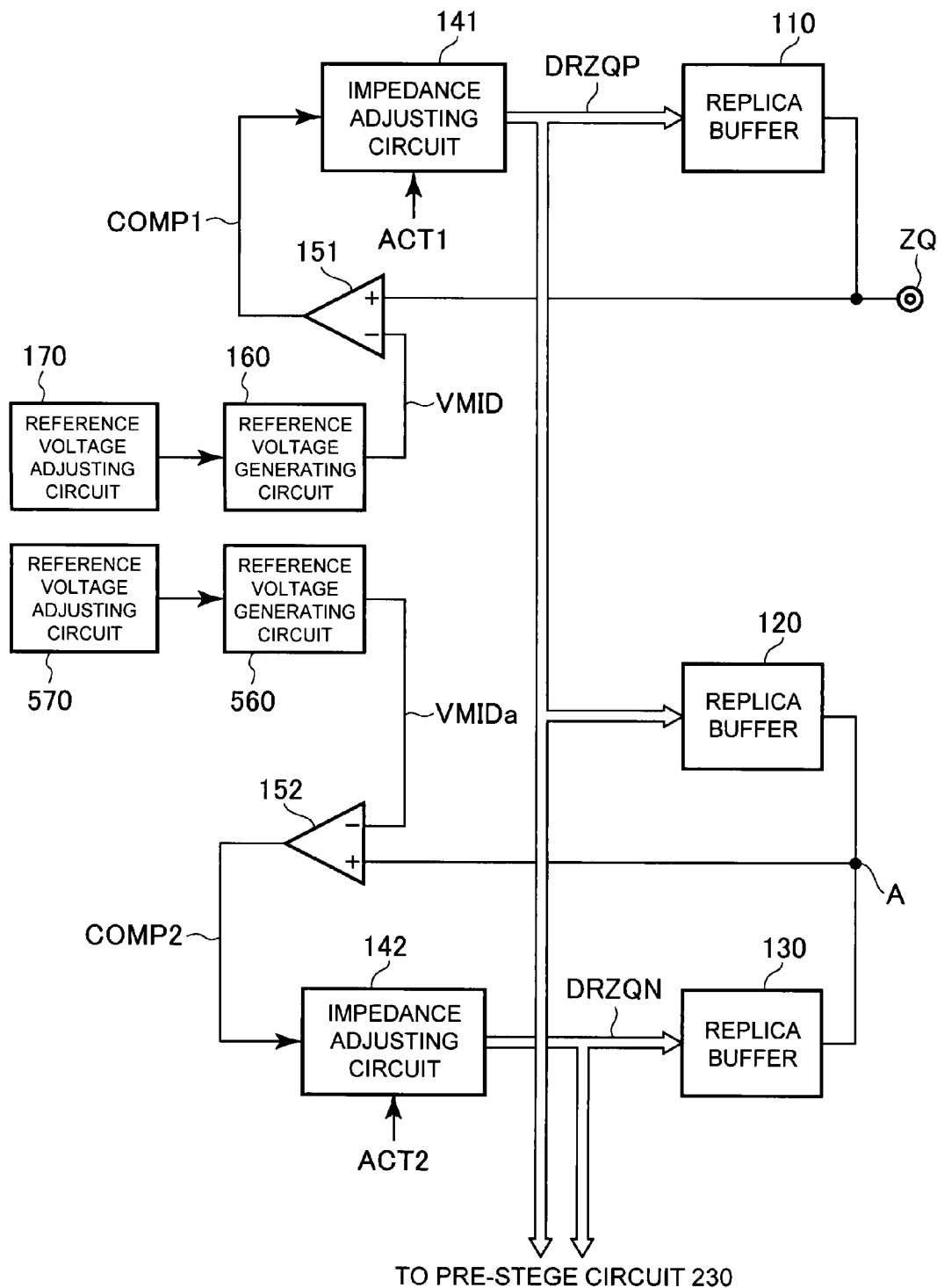
FIG. 12 is a circuit diagram of a calibration circuit according to a second embodiment of the present invention.

FIG. 12 is a circuit diagram of a calibration circuit 500 according to a second embodiment of the present invention.

The calibration circuit 500 according to the present embodiment is different from the first calibration circuit 100 in that the resistors 181 and 182 shown in FIG. 1 are replaced by a reference voltage generating circuit 560 and a reference voltage adjusting circuit 570. Other points are the same as those of the first calibration circuit 100 shown in FIG. 1. Therefore, constituent elements that are the same as those of the first calibration circuit 100 are assigned with like reference numbers, and their redundant explanations will be omitted.

In the present embodiment, a reference voltage VMIDa to be supplied to the comparing circuit 152 can be offset using the reference voltage generating circuit 560 and the reference voltage adjusting circuit 570. Circuit configurations of the reference voltage generating circuit 560 and the reference voltage adjusting circuit 570 are similar to the circuit configurations of the reference voltage generating circuit 160 and the reference voltage adjusting circuit 170, respectively, shown in FIG. 4.

The reference voltage VMIDa is offset to uniformize the rising waveform and the falling waveform of the output signal output from the data input and output terminal DQ. In other words, there is some difference between the I-V characteristic (current-voltage characteristic) of P-channel MOS transistors 211p to 215p and the I-V characteristic of N-channel MOS transistors 211n to 215n that constitute the output buffer 210. Therefore, even when both on-resistances are coincided, there is nonuniformity between the rising waveform and the falling waveform in some cases. This difference between the waveforms can be solved by providing a slight difference between the on-resistance of the P-channel MOS transistors 211p to 215p and the on-resistance of the N-channel MOS transistors 211n to 215n that constitute the output buffer 210.

From the above viewpoint, the calibration circuit 500 according to the present embodiment is configured to be able to offset the reference voltage used to carry out the impedance adjustment of the replica buffer 130. Therefore, when the calibration circuit 500 according to the present embodiment is used, the rising waveform and the falling waveform of the output signal can be made uniform, in addition to obtaining the above effect according to the above embodiment.

The semiconductor device according to the present invention is a semiconductor storage device such as a DRAM, for example, and takes a mode that plural DRAMs are provided on the memory module. However, the semiconductor device is not limited to this mode. A device that constitutes the external resistor Re includes a discrete part disposed on the memory module, and the like. Further, one external resistor Re is allocated to one semiconductor storage device, and also one external resistor Re is shared by plural semiconductor storage devices on the memory module.

The semiconductor device according to the present invention is also directly mounted on the data processing system. However, the configuration of the semiconductor device is not limited to this. A device constituting the external resistor Re can be mounted on the system substrate, and can be also mounted on the package of the semiconductor device. A resistance value of the external resistor Re can be optionally determined by the data processing system.

Figure 13:
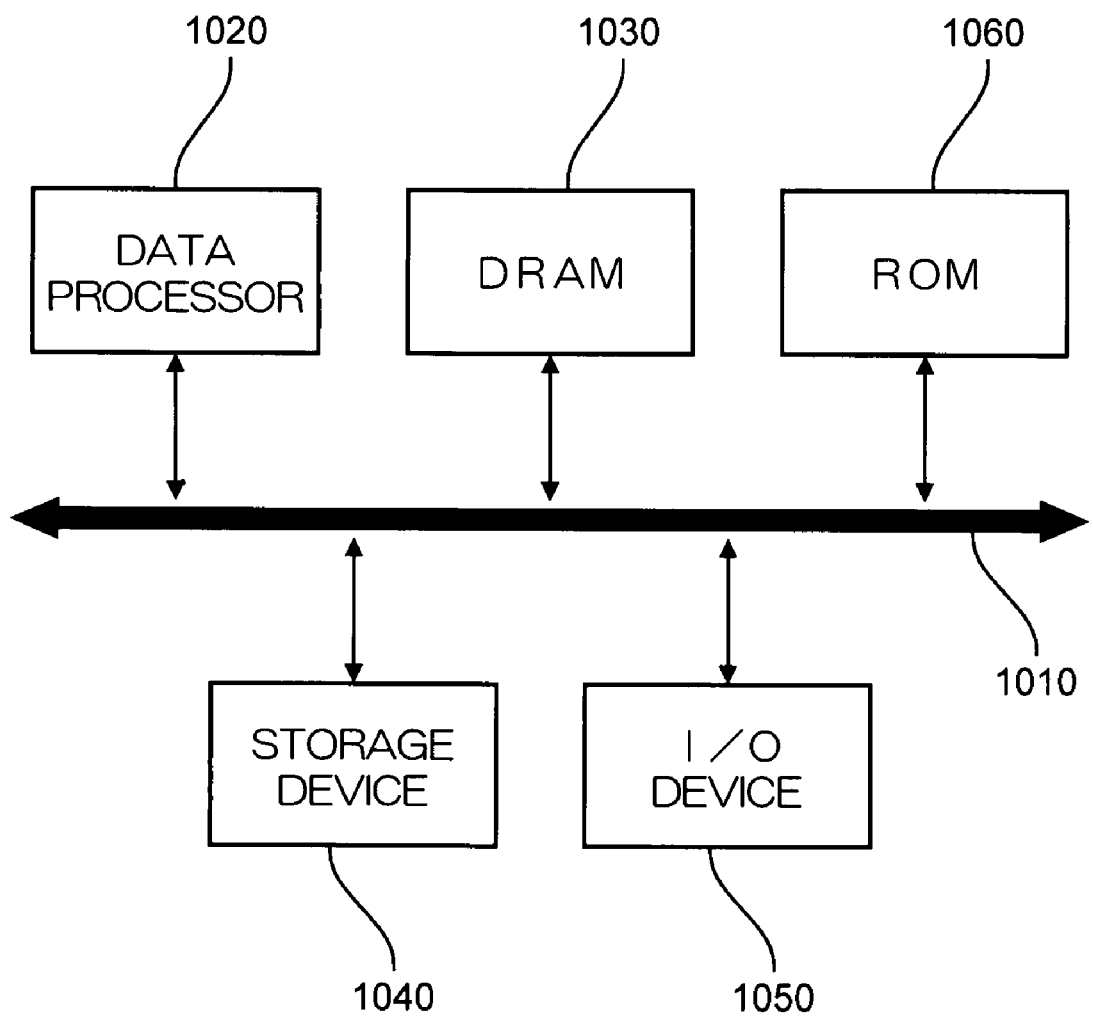
FIG. 13 is a block diagram showing a configuration of a data processing system according to a preferred embodiment of the present invention.

FIG. 13 is a block diagram showing a configuration of a data processing system 1000 using a semiconductor storage device according to a preferred embodiment of the present invention. The semiconductor storage device according to the present embodiment is a DRAM.

The data processing system 1000 shown in FIG. 13 includes a data processor 1020 and a semiconductor storage device (DRAM) 1030 according to the present embodiment connected to each other via a system bus 1010. The data processor 1020 includes a microprocessor (MPU) and a digital signal processor (DSP), for example. However, the constituent elements of the data processor 1020 are not limited to these. In FIG. 13, while the data processor 1020 and the DRAM 1030 are connected to each other via the system bus 1010, to simplify the explanation, the data processor 1020 and the DRAM 1030 can be connected to each other via a local bus without via the system bus 1010.

While only one set of the system bus 1010 is drawn to simplify the explanation in FIG. 13, the system bus can be set in series or in parallel via the connector according to need. In the memory system data processing system shown in FIG. 13, a storage device 1040, an I/O device 1050, and a ROM 1060 are connected to the system bus 1010. However, these are not necessarily essential constituent elements of the invention.

The storage device 1040 includes a hard disk drive, an optical disk drive, and a flash memory. The I/O device 1050 includes a display device such as a liquid-crystal display, and an input device such as a keyboard and a mouse. The I/O device 1050 may be any one of the input device and the output device. Further, while each one constituent element is drawn in FIG. 13 to simplify the explanation, the number of each constituent element is not limited to one, and may be one or two or more.

The present invention is in no way limited to the aforementioned embodiments, but rather various modifications are possible within the scope of the invention as recited in the claims, and naturally these modifications are included within the scope of the invention.

For example, the size of the transistor constituting the replica buffers 110, 120, and 130 does not need to be the same as the size of the transistor constituting the output buffer 210. So long as the impedances are substantially the same, a shrunk transistor can be used.

To decrease power consumption of the reference voltage generating circuit 160, a switch may be provided between the power source potential VDD and the resistor 161, and the switch may be turned on only when the calibration operation and the adjustment operation of the reference voltage are carried out. According to this arrangement, power consumption during a period while the reference voltage VMID is not used can be decreased.

In this case, when the total resistance value of the resistors 161 to 163 is set high, power consumption during the use of the reference voltage VMID can be also decreased. When the total resistance value of the resistors 161 to 163 is too high, the required time from when the switch is turned on until when the correct reference voltage VMID is output becomes long. Therefore, preferably, the total resistance value of the resistors 161 to 163 is set as high as possible, within a limit that the correct reference voltage VMID can be output, after the calibration operation is instructed by the external command until when the first count operation is started.

In the above embodiment, a parallel circuit including five transistors is used for the parallel circuit constituting the output buffer and the replica buffer. However, the number of transistors connected in parallel is not limited to five.

What is claimed is:

1. A semiconductor device comprising:
   first replica buffer coupled to a first calibration terminal;
   second replica buffer coupled to a second calibration terminal;
   third replica buffer coupled to the second calibration terminal;
   first reference voltage generating circuit generating a first reference voltage that is subject to be adjustable;
   second reference voltage generating circuit generating a second reference voltage that is fixed;
   first comparing circuit comparing a voltage of the first calibration terminal with the first reference voltage to control impedance of the first and second replica buffers; and
   a second comparing circuit comparing a voltage of the second calibration terminal with the second reference voltage to control an impedance of the third replica buffer.

2. The semiconductor device as claimed in claim 1, wherein the first reference voltage generating circuit includes a selector that selects the first reference voltage from one or more voltages of which potentials are different from each other, and includes a nonvolatile memory element.

3. The semiconductor device as claimed in claim 2, wherein the nonvolatile memory element is an electrically writable element.

4. The semiconductor device as claimed in claim 3, wherein the nonvolatile memory element is an antifuse.

5. The semiconductor device as claimed in claim 1, wherein the first reference voltage generating circuit includes a high-resistance part and a low-resistance part, and one or more voltages are taken out from the low-resistance part.

6. The semiconductor device as claimed in claim 5, wherein the high-resistance part includes a diffusion-layer resistor, and the low-resistance part includes a wiring resistor.

7. The semiconductor device as claimed in claim 1, wherein the first replica buffer has one of a pull-up function and a pull-down function, and the third replica buffer has the other of the pull-up function and a pull-down function.

8. A semiconductor device comprising:
   a first replica buffer coupled to a first calibration terminal;
   a second replica buffer coupled to a second calibration terminal;
   a third replica buffer coupled to the second calibration terminal;
   a first reference voltage generating circuit generating a first reference voltage;
   a second reference voltage generating circuit generating a second reference voltage that is substantially different from the first reference voltage;
   a first comparing circuit comparing a voltage of the first calibration terminal with the first reference voltage to control impedance of the first and second replica buffers; and
   a second comparing circuit comparing a voltage of the second calibration terminal with the second reference voltage to control an impedance of the third replica buffer.

9. The semiconductor device as claimed in claim 8, wherein the first reference voltage generating circuit includes a selector that selects the first reference voltage from one or more voltages of which potentials are different from each other, and includes a nonvolatile memory element.

10. The semiconductor device as claimed in claim 9, wherein the nonvolatile memory element is an electrically writable element.

11. The semiconductor device as claimed in claim 10, wherein the nonvolatile memory element is an antifuse.

12. The semiconductor device as claimed in claim 8, wherein the first reference voltage generating circuit includes a high-resistance part and a low-resistance part, and one or more voltages are taken out from the low-resistance part.

13. The semiconductor device as claimed in claim 12, wherein the high-resistance part includes a diffusion-layer resistor, and the low-resistance part includes a wiring resistor.

14. The semiconductor device as claimed in claim 8, wherein the first replica buffer has one of a pull-up function and a pull-down function, and the third replica buffer has the other of the pull-up function and a pull-down function.

15. A semiconductor device comprising:
   a first replica buffer coupled to a first calibration terminal;
   a second replica buffer coupled to a second calibration terminal;
   a third replica buffer coupled to the second calibration terminal;
   a first reference voltage generating circuit generating a first reference voltage that is subject to be adjustable to produce an adjusted first reference voltage;
   a second reference voltage generating circuit generating a second reference voltage that is subject to be adjustable to produce an adjusted second reference voltage, and the adjusted first reference voltage and the adjusted second reference voltages being different from each other;
   a first comparing circuit comparing a voltage of the first calibration terminal with the first reference voltage to control impedance of the first and second replica buffers; and
   a second comparing circuit comparing a voltage of the second calibration terminal with the second reference voltage to control an impedance of the third replica buffer.

16. A data processing system comprising a data processor and a semiconductor device, the semiconductor device including:
   a first replica buffer coupled to a first calibration terminal;
   a second replica buffer coupled to a second calibration terminal;
   a third replica buffer coupled to the second calibration terminal;
   a first reference voltage generating circuit generating a first reference voltage that is subject to be adjustable;
   a second reference voltage generating circuit generating a second reference voltage that is fixed;
   a first comparing circuit comparing a voltage of the first calibration terminal with the first reference voltage to control impedance of the first and second replica buffers; and a second comparing circuit comparing a voltage of the second calibration terminal with the second reference voltage to control an impedance of the third replica buffer.

17. A method comprising:

generating a first reference voltage;

generating a second reference voltage which is different from the first reference voltage;

comparing the first reference voltage with a voltage of a first calibration terminal to output a first control signal;

comparing the second reference voltage with a voltage of a second calibration terminal to output a second control signal; and adjusting impedance of first to third replica buffers in response to the first and second control signal.

18. The method as claimed in claim 17, wherein the adjusting comprises adjusting the impedance of first and second replica buffers in response to the first control signal, and adjusting the impedance of the third replica buffer in response to the second control signal after the first and second replica buffers are adjusted.

19. The method as claimed in claim 18, wherein the first replica buffer has one of a pull-up function and a pull-down function, and the third replica buffer has the other of the pull-up function and a pull-down function.

* * * * *